(12) United States Patent
Ko et al.

(10) Patent No.: US 8,535,981 B2
(45) Date of Patent: Sep. 17, 2013

(54) INTEGRATED CIRCUIT PACKAGE-ON-PACKAGE SYSTEM WITH UNDERFILLING STRUCTURES AND METHOD OF MANUFACTURE THEREOF

(75) Inventors: Chan Hoon Ko, Incheon (KR); SeungYun Ahn, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 238 days.

(21) Appl. No.: 13/045,523

(22) Filed: Mar. 10, 2011

(65) Prior Publication Data
US 2012/0228753 A1 Sep. 13, 2012

(51) Int. Cl.
*H01L 21/00* (2006.01)
(52) U.S. Cl.
USPC ............ 438/109; 438/112; 257/686; 257/777
(58) Field of Classification Search
USPC .......................... 438/109, 112; 257/686, 777
See application file for complete search history.

(56) References Cited

U.S. PATENT DOCUMENTS

| 6,861,288 | B2 | 3/2005 | Shim et al. | |
|---|---|---|---|---|
| 7,364,945 | B2 | 4/2008 | Shim et al. | |
| 2007/0257348 | A1 | 11/2007 | Yang | |
| 2008/0116556 | A1* | 5/2008 | Chou et al. | 257/686 |
| 2009/0091015 | A1* | 4/2009 | Shen et al. | 257/686 |

* cited by examiner

*Primary Examiner* — Phat X Cao
(74) *Attorney, Agent, or Firm* — Ishimaru & Associates LLP; I-Chang John Yang

(57) ABSTRACT

A method of manufacturing of an integrated circuit packaging system includes: providing a bottom package in a cavity in a central region of the bottom package having inter-package interconnects in the cavity; forming a vent on an inter-package connection side of the bottom package from an exterior of the bottom package to the cavity; mounting a top package on the inter-package interconnects; and applying an underfill through the vent and into the cavity.

10 Claims, 3 Drawing Sheets

INTEGRATED CIRCUIT PACKAGE-ON-PACKAGE SYSTEM WITH UNDERFILLING STRUCTURES AND METHOD OF MANUFACTURE THEREOF

TECHNICAL FIELD

The present invention relates generally to an integrated circuit packaging system, and more particularly to a system for an integrated circuit package-on-package system with underfilling structures.

BACKGROUND ART

A tremendous market growth for high density and high output/input integrated circuit packages has resulted in a trend for electronic products that are lightweight, smaller in size, multi-functional, and with ever increasing higher speeds. Electronic products such as cell phone base products, global positioning systems (GPS), satellites, communication equipment, consumer products, and a vast line of other similar products are in ever increasing global demand.

There is an important need that exists for parts in the package to become thinner and thinner to reduce the size of the whole package effectively without sacrificing performance and speed. Attempts have failed to provide a complete solution addressing simplified manufacturing processing, time to market, improved reliability, reduced electrical parts on the circuit boards, and size reductions of the circuit boards with increased functionality, leveragability, and increased product features to the consumer.

Thus, an increasing need remains to reduce parts mounted on the circuit boards while increasing functionality. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of operation of an integrated circuit packaging system including: providing a bottom package in a cavity in a central region of the bottom package having inter-package interconnects in the cavity; forming a vent on an inter-package connection side of the bottom package from an exterior of the bottom package to the cavity; mounting a top package on the inter-package interconnects; and applying an underfill through the vent and into the cavity.

The present invention provides an integrated circuit packaging system including: a bottom package with a cavity in a central region of the bottom package having a vent on an inter-package connection side of the bottom package from an exterior of the bottom package to the cavity; an inter-package interconnects in the cavity; an underfill in the cavity filled through the vent; and a top package on the inter-package interconnects.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
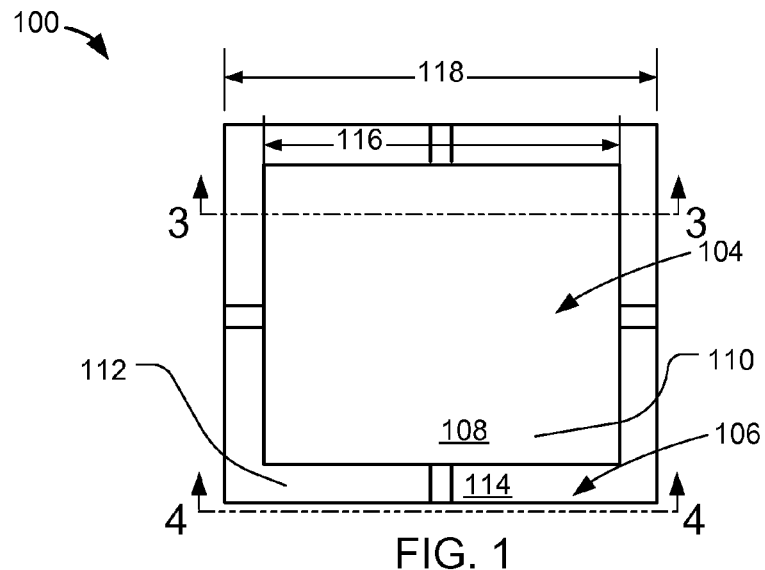
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of an integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

The term "package-on-package" ("PoP") as used herein includes packaging of devices, where each of the packages can be packaged and tested separately, and then stacked together in package form, wherein at least one package rests on top of another.

The term "Fan-In Package-on-Package" ("FiPoP") as used herein making connections between packages by means of a center ball array instead of a peripheral ball array, thereby decoupling the size of the top package from that of the bottom package.

Referring now to FIG. 1, therein is shown a top view of an integrated circuit packaging system 100 in a first embodiment of the present invention. The integrated circuit packaging system 100 can include a top package 104 and a bottom package 106. The top package 104 and the bottom package 106 are both semiconductor packages.

A semiconductor package is the housing and interconnections of integrated circuits ("ICs") and electronic components to form an electronic system, where the ICs and the electronic components are encapsulated in the package. The semiconductor package functions as a structure to provide physical support, environmental protection, heat removal, and signal and power access for the ICs and electronic components. The semiconductor package can be made of molded plastic, ceramic, or other non-conductive material inside which is embedded one or more discrete or integrated electronic components, which may be connected and used within an electronic circuit. The discrete components are typically etched in silicon wafer before being cut and assembled in a package.

The top package 104 includes a top encapsulation 108, which is a protective cover for the top package 104 such as a molding compound. The top encapsulation 108 can have a top-package side 110. The top-package side faces away from the bottom package 106. The top package 104 is depicted to mount on top of an inter-package connection side 112 of the bottom package 106. The inter-package connection side 112 faces toward the top package 104. The bottom package 106 includes a bottom encapsulation 114, which is a protective cover for the bottom package 106 such as a molding compound.

For illustrative purposes, the integrated circuit packaging system 100 is shown with the top package 104 and the bottom package 106 having a square geometric configuration, although it is understood that the top package 104 or the bottom package 106 can each have a different geometric configuration. For example, the integrated circuit packaging system 100 can have the top package 104 with a rectangular geometric configuration, or a configuration having non-perpendicular corners.

Also for illustrative purposes, the integrated circuit packaging system 100 is shown with the top package 104 having a top package width 116 smaller than a bottom package width 118 of the bottom package 106, although it is understood that the top package 104 can have the top package width 116 larger than or equal to the bottom package width 118. For example, the top package 104 has a smaller top-bottom surface area than the bottom package 106, although it is understood that the top package 104 or the bottom package 106 can have different geometric sizes, such as the bottom package 106 being smaller than the top package 104 in surface area.

The top package 104 and the bottom package 106 can be in a Fan-In Package-on-Package (FiPoP) configuration as defined above. The top package 104 can be a flip chip package, a Quad Flat Package (QFP), a Quad Flat No Leads (QFN) package, a Ball Grid Array (BGA) package, or a Land Grid Array (LGA) package. The bottom package 106 can also be a flip chip package, a Quad Flat Package (QFP), a Quad Flat No Leads (QFN) package, a Ball Grid Array (BGA) package, or a Land Grid Array (LGA) package.

Figure 2:
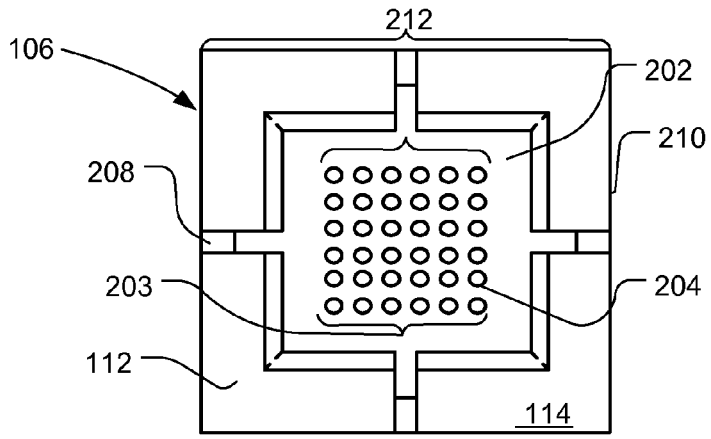
FIG. 2 is a top view of the bottom package of FIG. 1.

Referring now to FIG. 2, therein is shown a top view of the bottom package 106 of FIG. 1. The bottom package 106 can include inter-package interconnects 204. The bottom package 106 also includes a cavity 202 in an interior region 203 that may include a central region on the inter-package connection side 112 exposing the inter-package interconnects 204. The inter-package interconnects 204 function to make electrical connections between the top package 104 of FIG. 1 and the bottom package 106. The inter-package interconnects 204 can be solder balls, leads, conductive protrusions, or a combination thereof.

The bottom encapsulation 114 includes vents 208 extending from an exterior 210 of the bottom package 106 to the cavity 202. The exterior 210 of the bottom package 106 can include peripheral sides 212. The vents 208 are shown, for example, extending along the inter-package connection side 112 of the bottom package 106. There can be any number of the vents 208 on the bottom encapsulation 114, including one extending from each of the peripheral sides 212 of the bottom package 106 as shown in FIG. 2.

The vents 208 are made for injection of fluids, such as an application of an underfill, in a later stage of manufacturing. The vents 208 can be narrow, where capillary phenomenon can help the flow of the fluids traveling in the vents 208, especially for fluids of high viscosity than fluids of low viscosity.

The vents 208 can be straight or curved. The vents 208 can have different geometries from each other. The vents 208 are shown, for example, as rectangular trenches along the inter-package connection side 112 of the bottom package 106, but it is understood that the vents 208 can be of different geometric shapes such as cylindrical trenches or triangular grooves. For illustrative purposes, each of the vents 208 is shown to form along a center dividing plane of a peripheral side of the bottom package 106, although it is understood that the vents 208 can form along any path leading to the cavity 202.

Figure 3:
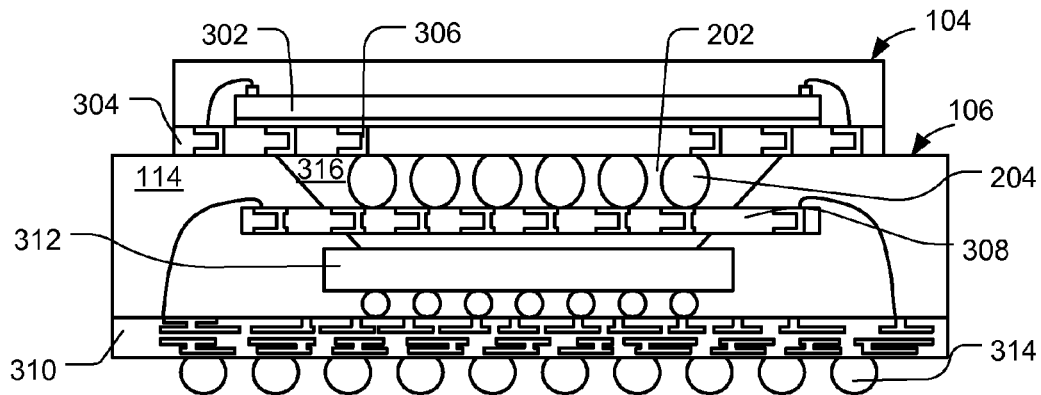
FIG. 3 is a cross-sectional view of the integrated circuit packaging system along line 3-3 of FIG. 1.

Referring now to FIG. 3, therein is shown a cross-sectional view of the integrated circuit packaging system 100 along line 3-3 of FIG. 1. The top package 104 can include a top integrated circuit die 302 and a top substrate 304. The top substrate 304 can be, for example, a substrate with vias. The top substrate 304 can include top contact structures 306 for making an electrical connection with the inter-package interconnects 204 of the bottom package 106. The top contact structures 306 can be vias, contact pads, contact holes, or solder balls. The top integrated circuit die 302 can be wire-bonded to the top substrate 304. The top integrated circuit die 302 can also have a flip-chip attachment to the top substrate 304.

As an example, the top package 104 is shown with the top integrated circuit die 302 electrically connected to the top substrate 304, and the top substrate 304 electrically connected to the inter-package interconnects 204. The inter-package interconnects 204 can be electrically connected to an interposer 308, and the interposer 308 can be electrically connected to a bottom substrate 310. The bottom substrate 310 can be electrically connected to a bottom integrated circuit die 312.

In the example, the top integrated circuit die 302 is over the top substrate 304. The top substrate 304 is over and on the inter-package interconnects 204. The inter-package interconnects 204 is over and on the interposer 308. The interposer 308 is over the bottom integrated circuit die 312. The bottom integrated circuit die 312 is over the bottom substrate 310, and the bottom substrate 310 is over and on external interconnects 314.

The cavity 202 can expose both the inter-package interconnects 204 and the interposer 308. The cavity 202 can have a sloping height from the inter-package connection side 112 of the bottom package 106 to the interposer 308. The inter-package interconnects 204 can create a gap (not shown) between the top substrate 304 and the bottom encapsulation 114, such as when heights of the inter-package interconnects exceeds a height of the cavity 202.

The bottom package 106 can include the bottom integrated circuit die 312 and the bottom substrate 310. The bottom substrate 310 can be, for example, a substrate with vias. The bottom substrate 310 can include external interconnects 314 for making external electrical connections. The external interconnects 314 can be vias, contact pads, contact holes, or solder balls. The bottom integrated circuit die 312 can be wire-bonded to the bottom substrate 310. The bottom integrated circuit die 312 can also have a flip-chip attachment to the bottom substrate 310.

An underfill 316 can partially or completely fill the cavity 202 for providing increased reliability of the inter-package interconnects 204 and structural support for the top package 104. The underfill 316 can be cured after filling, or can be left un-cured. For example, the underfill 316 can be an epoxy filling. The underfill 316 can also completely or partially fill the cavity 202. The underfill 316 can be made of the same material as either the top encapsulation 108 or the bottom encapsulation 114.

The underfill 316 can partially fill the vents 208 as a residual result of using the vents 208 to inject the underfill 316 into the cavity 202 during an injection stage of processing. The underfill 316 can travel through the vents 208 through capillary effects. The underfill 316 can also completely fill the vents 208. The vents 208 can be used to provide pressure release to speed up the flow of the underfill 316. The vents 208 can also be used to provide equalized travel path of the underfill 316 in order to avoid voids or bubbles of the underfill 316 forming in the cavity 202. The vents 208 can further be used to provide a wider path to enable viscous liquid materials to act as the underfill 316.

Figure 4:
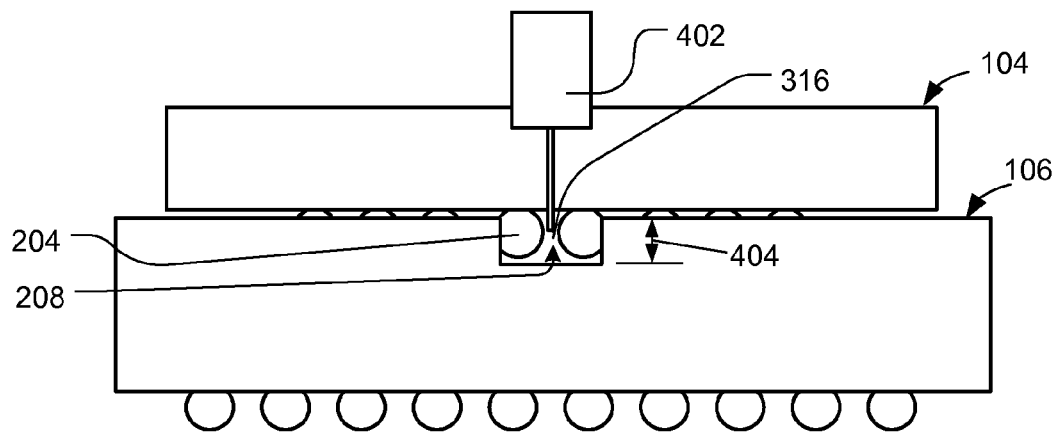
FIG. 4 is a side view of the integrated circuit packaging system along line 4-4 of FIG. 1 during underfilling stage of manufacturing.

Referring now to FIG. 4, therein is shown a side view of the integrated circuit packaging system 100 along line 4-4 of FIG. 1 during underfilling stage of manufacturing. The top package 104 is shown on top of the bottom package 106. The inter-package interconnects 204 in the cavity 202 of FIG. 2 are shown to be accessible through the vents 208, exposed from the bottom encapsulation 114 of FIG. 1. The inter-package interconnects 204 can create a gap (as shown) between the top package 104 and the bottom encapsulation 114, such as when heights of the inter-package interconnects exceeds a height of the cavity 202.

Vent depths 404 of the vents 208 can have varying heights amongst each other. Each of the vent depths 404 can also have a varying height, such as a constant sloped depth, a stepped depth, or a constant depth.

An underfiller system 402 is shown applying or injecting the underfill 316, such as an epoxy filling, through the vents 208 and into the cavity 202 of FIG. 2. The underfiller system 402 functions to inject underfiller material into the cavity 202 for protecting the inter-package interconnects 204 from movement, corrosion, or other damages. The underfiller system 402 accesses the cavity 202 from a peripheral side of the bottom package 106 through one end of the vents 208. The underfiller system 402 can have more than one injection stream into the vents 208 through different ends of the vents 208. The underfiller system 402 can fill simultaneously from different ends of the vents 208. As a result, the underfill 316 can have characteristics of the underfill 316 being filled from different ends of the vents 208, such as recesses of the underfill 316 near entry points of the underfill 316.

The vents 208 can be formed on the bottom package 106 through laser grooving, blade grinding, or partial molding. The vents 208 formed from blade grinding can have characteristics of blade grinding, such as blade grind marks. The vents 208 formed from laser grooving can have characteristics of laser grooving, such as laser burn marks. The vents 208 formed from partial molding can have characteristics of partial molding, such as smooth and continuous vent surface. The vents 208 can be formed during or after the encapsulation process for the bottom package 106. The vents 208 can be formed prior to or after the bottom package 106 is cured. The vents 208 formed during encapsulation or prior to the bottom package 106 being cured can have can have characteristics of forming prior to the bottom package 106 being cured, such as a smooth vent surface.

It has been discovered that the present invention provides the integrated circuit packaging system 100 having increased packaging reliability. The vents 208 from some or all peripheral sides of the bottom package 106 serve to quickly flow the underfill 316 into the cavity 202 before the underfill 316 hardens and to provide an equal distribution of the underfill 316. Equalized and increased flow can improve the packaging reliability by forming the underfill 316 without voids to protect the inter-package interconnects 204 from corrosion and structural damage. The vents 208 thereby increase packaging reliability by equalizing and increasing the flow of the underfill 316.

Figure 5:
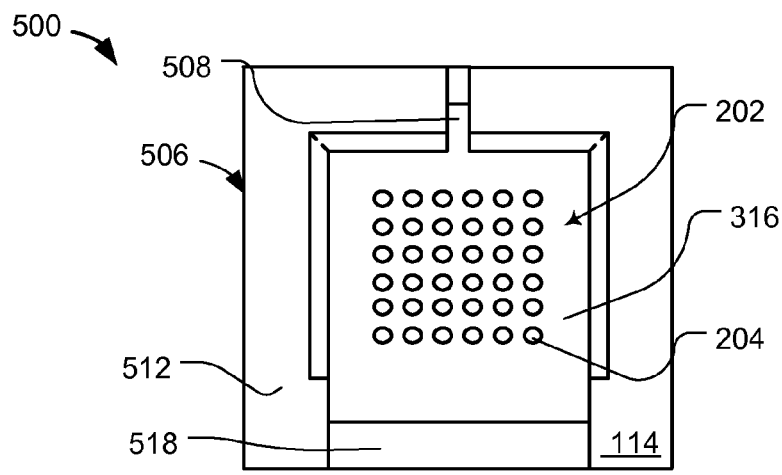
FIG. 5 is a top view of a bottom package of an integrated circuit packaging system in a second embodiment of the present invention.

Referring now to FIG. 5, therein is shown a top view of a bottom package 506 of an integrated circuit packaging system 500 in a second embodiment of the present invention. Vents 508 on inter-package connection side 512 is shown to include a wide groove 518. The wide groove 518 can be connected with the cavity 202 thus allowing the underfill 316 of FIG. 3 to enter through the wide groove 518 then filling the cavity 202. The wide groove 518 can have the width of the cavity 202. The underfill 316 can also enter through other instances of the vents 508, then throughout the cavity 202, and then all the way through to the wide groove 518.

It has been discovered that the present invention provides the integrated circuit packaging system 500 having increased packaging reliability. The wide groove 518 serves to increase the flow of the underfill 316. The wide groove 518 also serves to avoid bubbles or voids in the underfill 316 by removing underfilling bottlenecks. Increased flow and lack of voids can improve the packaging reliability by protecting the inter-package interconnects 204 from corrosion and structural damage. The wide groove 518 thereby increases packaging reliability by increasing the flow of the underfill 316 and avoiding voids.

Figure 6:
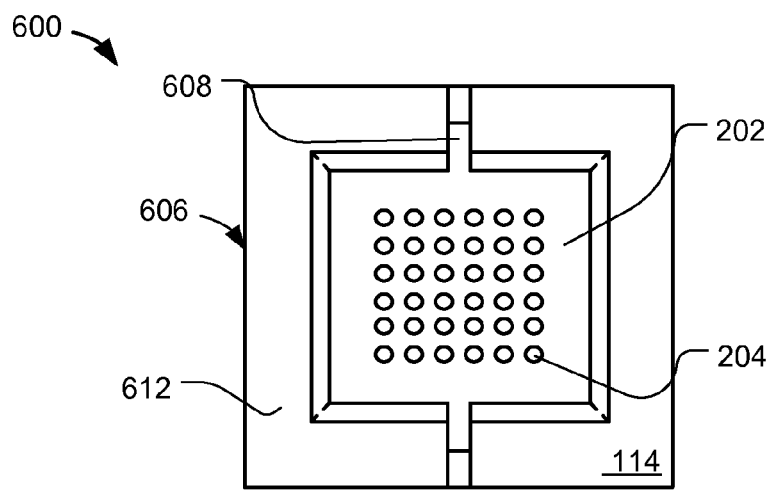
FIG. 6 is a top view of a bottom package of an integrated circuit packaging system in a third embodiment of the present invention.

Referring now to FIG. 6, therein is shown a top view of a bottom package 606 of an integrated circuit packaging system 600 in a third embodiment of the present invention. Inter-package connection side 612 of the bottom package 606 is shown to include only a pair of vents 608 on opposite sides of the bottom encapsulation 114.

It has been discovered that the present invention provides the integrated circuit packaging system 600 having increased packaging reliability. Having a pair of the vents 608 on opposite sides serves to increase the flow of the underfill 316 of FIG. 3 and minimizes the amount of grooving, grinding or partial molding on the bottom encapsulation 114 required to create the vents 608. Increased flow can improve the packaging reliability by protecting the inter-package interconnects 204 from corrosion and structural damage. Minimizing the amount of grooving, grinding or partial molding preserves the structural integrity of the bottom encapsulation 114. The vents 608 thereby increase packaging reliability by increasing the flow of the underfill 316 and preserving the structural integrity of the bottom encapsulation 114.

Figure 7:
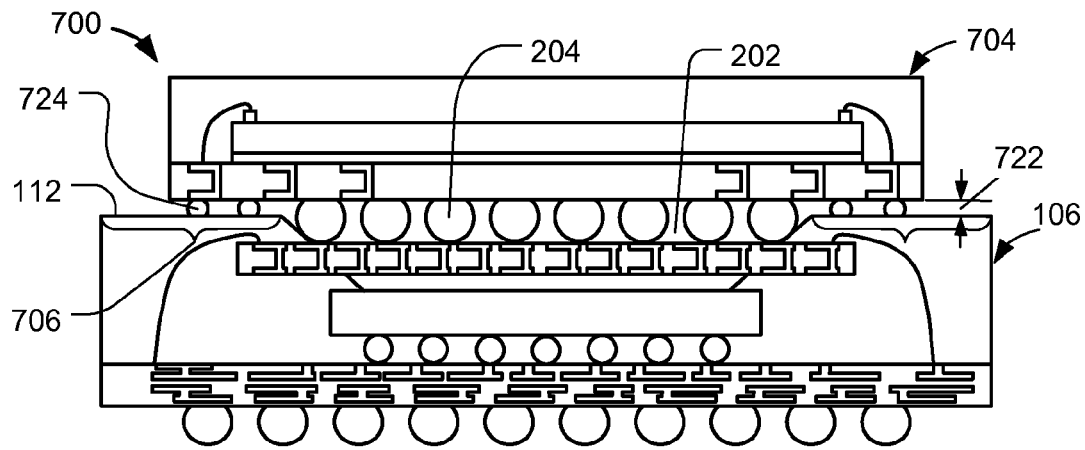
FIG. 7 is a cross-sectional view of an integrated circuit packaging system in a fourth embodiment of the present invention.

Referring now to FIG. 7, therein is shown a cross-sectional view of an integrated circuit packaging system 700 in a fourth embodiment of the present invention. A top package 704 is shown on top of the bottom package 106 with a marginal gap 722 in between having bumps 724. The marginal gap 722 is created by mounting the top package 704 with the bumps 724 on a peripheral region 706 of the inter-package connection side 112 of the bottom package 106. The bumps 724 can be epoxy bumps, solder-on-pads, solder bumps, or other small structures for creating a marginal gap between the top package 704 and the bottom package 106.

It has been discovered that the present invention provides the integrated circuit packaging system 700 having increased packaging reliability. The marginal gap 722 and the bumps 724 serve to equalize and increase the flow of the underfill 316 of FIG. 2 by creating an air pressure release route during the application of the underfill 316 and by providing a path for capillary action of the underfill 316. Equalized and increased flow can improve the packaging reliability by forming the underfill 316 dispensed equally in the cavity 202 of the bottom package 106 to protect the inter-package interconnects 204 from corrosion and structural damage. The marginal gap 722 and the bumps 724 thereby increase packaging reliability by equalizing and increasing the flow of the underfill 316.

Figure 8:
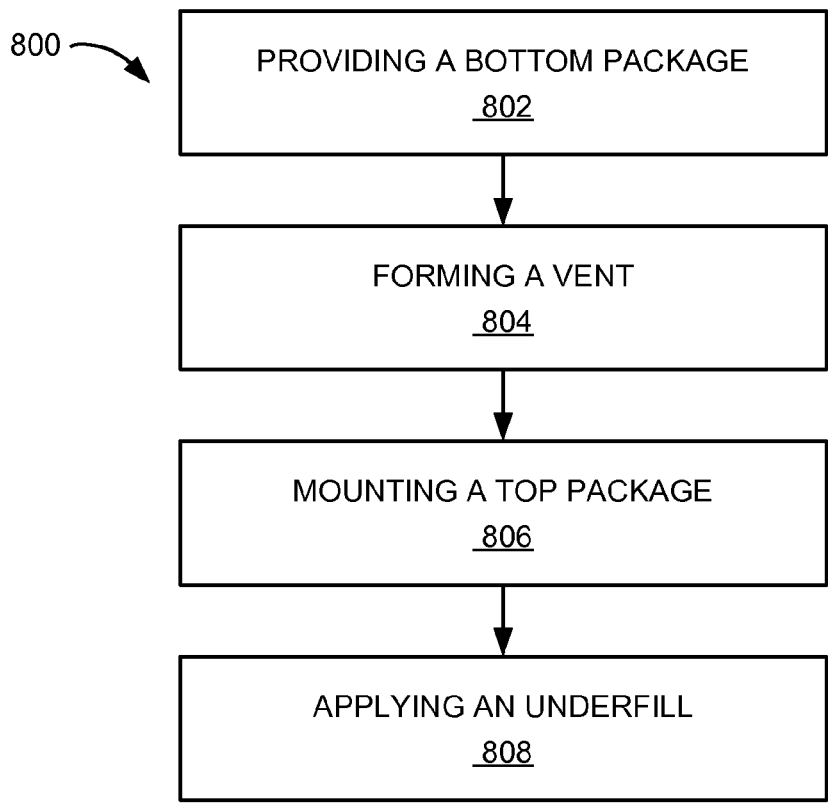
FIG. 8 is a flow chart of a method of manufacture of the integrated circuit packaging system in a further embodiment of the present invention.

Referring now to FIG. 8 therein is shown a flow chart of a method of manufacture of the integrated circuit packaging system in a further embodiment of the present invention. The method includes: providing a bottom package in a cavity in a central region of the bottom package having inter-package interconnects in the cavity, in a block 802; forming a vent on an inter-package connection side of the bottom package from an exterior of the bottom package to the cavity, in a block 804; mounting a top package on the inter-package interconnects, in a block 806; and applying an underfill through the vent and into the cavity, in a block 808.

The resulting method, process, apparatus, device, product, and system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a bottom package with a cavity in a central region of the bottom package having inter-package interconnects in the cavity;
    forming a vent on an inter-package connection side of the bottom package from an exterior of the bottom package to the cavity;
    mounting a top package on the inter-package interconnects; and
    applying an underfill through the vent and into the cavity.

2. The method as claimed in claim 1 wherein forming the vent includes forming a further vent with a different geometry than the vent.

3. The method as claimed in claim 1 further comprising:
    forming bumps on a peripheral region of the inter-package connection side of the bottom package; and
wherein:
    mounting the top package includes mounting the top package on the bumps to form a marginal gap between the top package and the bottom package.

4. The method as claimed in claim 1 wherein forming the vent includes forming a wide groove on the inter-package connection side from the exterior of the bottom package, exposing the inter-package interconnects in the cavity.

5. The method as claimed in claim 1 wherein forming the vent includes forming a pair of the vents from opposite sides of the bottom package.

6. A method of manufacture of an integrated circuit packaging system comprising:
    providing a bottom package with a cavity in a central region of the bottom package having inter-package interconnects in the cavity, the cavity exposing an interposer;
    forming a vent on an inter-package connection side of the bottom package from an exterior of the bottom package to the cavity;
    mounting a top package on the inter-package interconnects, the inter-package connection side facing the top package; and
    applying an underfill through the vent and into the cavity.

7. The method as claimed in claim 6 wherein forming the vent includes forming vents on each of peripheral sides of the bottom package.

8. The method as claimed in claim 6 wherein mounting the top package includes forming a marginal gap between the top package and the bottom package for increasing flow of the underfill.

9. The method as claimed in claim 6 wherein forming the vent includes forming the vent before the bottom package is cured.

10. The method as claimed in claim 6 wherein forming the vent includes forming the vent having a vent depth with varying height.

* * * * *